(12) United States Patent
Yoon et al.

(10) Patent No.: US 11,839,112 B2
(45) Date of Patent: Dec. 5, 2023

(54) DISPLAY APPARATUS

(71) Applicant: Samsung Display Co., Ltd., Yongin-Si (KR)

(72) Inventors: Juwon Yoon, Yongin-si (KR); Taehoon Yang, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 216 days.

(21) Appl. No.: 17/370,857

(22) Filed: Jul. 8, 2021

(65) Prior Publication Data

US 2022/0199724 A1    Jun. 23, 2022

(30) Foreign Application Priority Data

Dec. 18, 2020 (KR) ........................ 10-2020-0178926

(51) Int. Cl.
  *H01L 27/14* (2006.01)
  *H10K 59/121* (2023.01)

(52) U.S. Cl.
  CPC ..... *H10K 59/1213* (2023.02); *H10K 59/1216* (2023.02)

(58) Field of Classification Search
  CPC .......... H10K 59/1213; H10K 59/1216; H10K 59/124; H10K 59/131; H01L 27/1225; H01L 27/124; H01L 27/1251; H01L 27/1255; H01L 27/1248; H01L 27/3276; H01L 27/3265; H01L 27/3262; H01L 27/3258
  USPC ..................................................... 257/59, 72
  See application file for complete search history.

(56) References Cited

U.S. PATENT DOCUMENTS

| | | | |
|---|---|---|---|
| 9,129,927 B2 | 9/2015 | Gupta et al. | |
| 9,466,652 B2* | 10/2016 | Kim | .................... H01L 27/1255 |
| 9,923,039 B2* | 3/2018 | Ahn | ...................... H01L 27/127 |
| 10,741,625 B2 | 8/2020 | Kang et al. | |
| 2015/0243687 A1 | 8/2015 | Lee et al. | |
| 2018/0286888 A1 | 10/2018 | Yamaguchi et al. | |
| 2019/0288048 A1* | 9/2019 | Kang | .................. G09G 3/3233 |
| 2020/0350341 A1 | 11/2020 | Hanada et al. | |
| 2022/0020836 A1 | 1/2022 | Gong | |

FOREIGN PATENT DOCUMENTS

| | | |
|---|---|---|
| CN | 111785759 A | 10/2020 |
| KR | 10-2015-0101409 A | 9/2015 |
| KR | 10-2001357 B1 | 7/2019 |
| KR | 10-2019-0108220 A | 9/2019 |

* cited by examiner

*Primary Examiner* — Tan N Tran
(74) *Attorney, Agent, or Firm* — Innovation Counsel LLP

(57) ABSTRACT

A display apparatus includes a substrate including a display area in which a display element is arranged, a first thin-film transistor arranged in the display area and including a first semiconductor layer and a first gate electrode insulated from the first semiconductor layer, the first semiconductor layer including a silicon semiconductor, a first interlayer insulating layer covering the first gate electrode, a second thin-film transistor on the first interlayer insulating layer and including a second semiconductor layer and a second gate electrode insulated from the second semiconductor layer, the second semiconductor layer including an oxide semiconductor, and an upper electrode arranged on the first interlayer insulating layer and including a same material as that of the second semiconductor layer and at least overlapping the first gate electrode.

18 Claims, 12 Drawing Sheets

DISPLAY APPARATUS

CROSS-REFERENCE TO RELATED APPLICATION

This application is based on and claims priority under 35 U.S.C. § 119 to Korean Patent Application No. 10-2020-0178926, filed on Dec. 18, 2020, in the Korean Intellectual Property Office, the disclosure of which is incorporated by reference herein in its entirety.

BACKGROUND

1. Field

The present disclosure generally relates to a display apparatus, and more particularly, to a display apparatus driven via a thin-film transistor including a silicon semiconductor and a thin-film transistor including an oxide semiconductor.

2. Description of the Related Art

Generally, a display apparatus includes a display element and a driving circuit controlling an electrical signal applied to the display element. The driving circuit includes a thin-film transistor (TFT), a storage capacitor, and a plurality of lines.

To accurately control whether to allow light emission from the display element and a level of the light emission, the number of thin-film transistors electrically connected to a single display element has increased. Accordingly, there is need to develop a novel method of addressing the high integration degree and power consumption of a display apparatus is actively conducted.

SUMMARY

One or more embodiments include a display apparatus that is driven via a thin-film transistor including a silicon semiconductor and a thin-film transistor including an oxide semiconductor to thereby reduce power consumption of the display apparatus and also allow a high integration degree of the display apparatus.

However, the above objective is an example, and the scope of the embodiments of the present disclosure is not limited by the above objective.

Additional aspects will be set forth in part in the description which follows and, in part, will be apparent from the description, or may be learned by practice of the presented embodiments of the disclosure.

According to one or more embodiments, a display apparatus includes a substrate including a display area in which a display element is arranged, a first thin-film transistor arranged in the display area and including a first semiconductor layer including a silicon semiconductor and a first gate electrode insulated from the first semiconductor layer, a first interlayer insulating layer covering the first gate electrode, a second thin-film transistor disposed on the first interlayer insulating layer and including a second semiconductor layer and a second gate electrode insulated from the second semiconductor layer, the second semiconductor layer including an oxide semiconductor, and an upper electrode arranged on the first interlayer insulating layer and including a same material as that of the second semiconductor layer and overlapping at least a portion of the first gate electrode.

The display apparatus may further include a lower electrode arranged on a same layer as the first gate electrode, wherein the lower electrode and the upper electrode constitute a capacitor.

The first gate electrode and the lower electrode may be integrally formed.

At least a portion of the upper electrode may be imparted with conductivity.

An opening having a closed shape may be formed in the upper electrode.

The display apparatus may further include a first gate insulating layer covering the first semiconductor layer.

The second thin-film transistor may further include a third gate electrode disposed on the first gate insulating layer, and the third gate electrode may at least partially overlap the second semiconductor layer.

The display apparatus may further include a second gate insulating layer disposed between the second semiconductor layer and the second gate electrode.

The display apparatus may further include a second interlayer insulating layer on the second gate electrode.

The display apparatus may further include a first electrode arranged on the second gate insulating layer.

The display apparatus may further include a second electrode disposed on the second interlayer insulating layer and including one end electrically connected to the upper electrode and another end electrically connected to the first electrode.

The display apparatus may further include a planarization layer covering the second electrode, wherein the display element includes an organic light-emitting diode arranged on the planarization layer.

According to one or more embodiments, a display apparatus includes a substrate including a display area in which a display element is arranged, a first thin-film transistor arranged in the display area and including a first semiconductor layer and a first gate electrode insulated from the first semiconductor layer, the first semiconductor including a silicon semiconductor, a first interlayer insulating layer covering the first gate electrode, and a capacitor including a lower electrode on a same layer as the first gate electrode and an upper electrode that is arranged on the first interlayer insulating layer, at least partially overlaps the lower electrode, and includes an oxide semiconductor.

The first gate electrode and the lower electrode may be integrally formed.

At least a portion of the upper electrode may be imparted with conductivity.

The display apparatus may further include a second thin-film transistor on the first interlayer insulating layer and including a second semiconductor layer and a second gate electrode insulated from the second semiconductor layer, the second semiconductor layer including an oxide semiconductor.

The display apparatus may further include a second interlayer insulating layer disposed on the second gate electrode.

The display apparatus may further include a first electrode disposed on a same layer as the second gate electrode, and a second electrode disposed on the second interlayer insulating layer and having one end electrically connected to the upper electrode and another end electrically connected to the first electrode.

The upper electrode and the second semiconductor layer may include a same material as each other.

The second thin-film transistor may further include a third gate electrode disposed on a same layer as the first gate electrode, and the third gate electrode may at least partially overlap the second semiconductor layer.

Other aspects, features, and advantages other than those described above will become apparent from the accompanying drawings, the appended claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
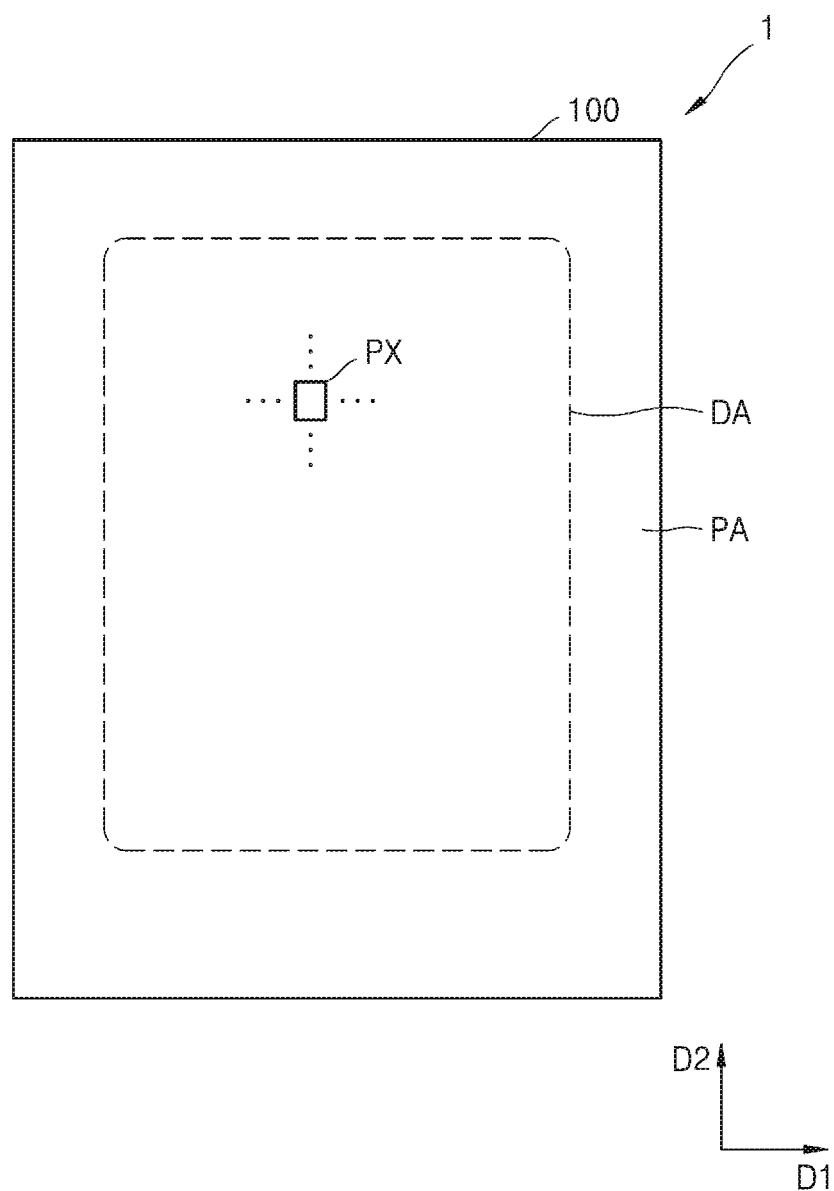
FIG. 1 is a view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

It will be understood that although the terms "first," "second," etc., may be used herein to describe various elements, these elements should not be limited by these terms. These terms are only used to distinguish one element from another.

In the embodiments below, the singular forms include the plural forms unless the context clearly indicates otherwise.

In the present specification, it is to be understood that the terms such as "including" or "having" are intended to indicate the existence of the features or elements disclosed in the specification, and are not intended to preclude the possibility that one or more other features or elements may be added.

In the embodiments below, it will be understood that when a portion such as a layer, an area, or an element is referred to as being "on" or "above" another portion, it can be directly on or above the other portion, or intervening portion may also be present.

Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

In the present specification, "A and/or B" refers to A, B, or A and B. In addition, "at least one of A and B" refers to A, B, or A and B.

In the embodiments below, when a line is described as "extending in a first direction or a second direction," it means that the line extends not only in a straight line but also in a zigzag line or a curve in the first or second direction.

In the embodiments below, the term "on a plane" refers to a view of an object viewed from above, and "on a cross-section" refers to a view of a vertical cross-section of an object viewed from a side. In the embodiments below, when referred to as "overlapping," this includes overlapping "on a plane" and "on a cross-section."

Hereinafter, the embodiments of the present disclosure will be described in detail with reference to the accompanying drawings, and in the description with reference to the drawings, like reference numerals refer to like elements.

FIG. 1 is a view schematically illustrating a display apparatus according to an embodiment.

Referring to FIG. 1, a display apparatus 1 according to an embodiment may be implemented as an electronic device such as a smartphone, a mobile phone, a navigation device, a game player, a TV, a head unit for vehicles, a notebook computer, a laptop computer, a tablet computer, a personal media player (PMP), a personal digital assistant (PDA), or the like. Also, the electronic device may be a flexible device.

A substrate 100 may be divided into a display area DA on which an image is displayed and a peripheral area PA arranged around the display area DA.

The substrate 100 may include various materials such as glass, metal, or plastic. In an embodiment, the substrate 100 may include a flexible material. The flexible material refers to a substrate that is easily bent and curved and is foldable or rollable. The substrate 100 including a flexible material may include super-slim glass, metal, or plastic.

Pixels PX including various display elements such as an organic light-emitting diode (OLED) may be arranged in the display area DA of the substrate 100. The pixels PX are provided in a plural number, and the plurality of pixels PX may be arranged in various forms such as a stripe arrangement, a pentile arrangement, or a mosaic arrangement to realize an image.

In an embodiment, when viewing the display area DA from a top plan, the display area DA may have a rectangular shape as illustrated in FIG. 1. In an embodiment, the display area DA may have a polygonal shape such as a triangle, a pentagon, a hexagon, or the like, or a circular shape, an oval shape, or an amorphous shape, or the like.

The peripheral area PA of the substrate 100 is an area around the display area DA, where an image is not displayed. Various lines configured to transfer an electrical signal to be applied to the display area DA, a printed circuit board or a driver integrated circuit (IC) chip may be located in the peripheral area PA.

Hereinafter, for convenience, the display apparatus 1 including an organic light-emitting diode as a display element will be described. However, the embodiments may be applied to a display apparatus 1 of various types such as a liquid crystal display apparatus, an electrophoretic display apparatus, an inorganic electroluminescent (EL) display apparatus, or the like.

Figure 2:
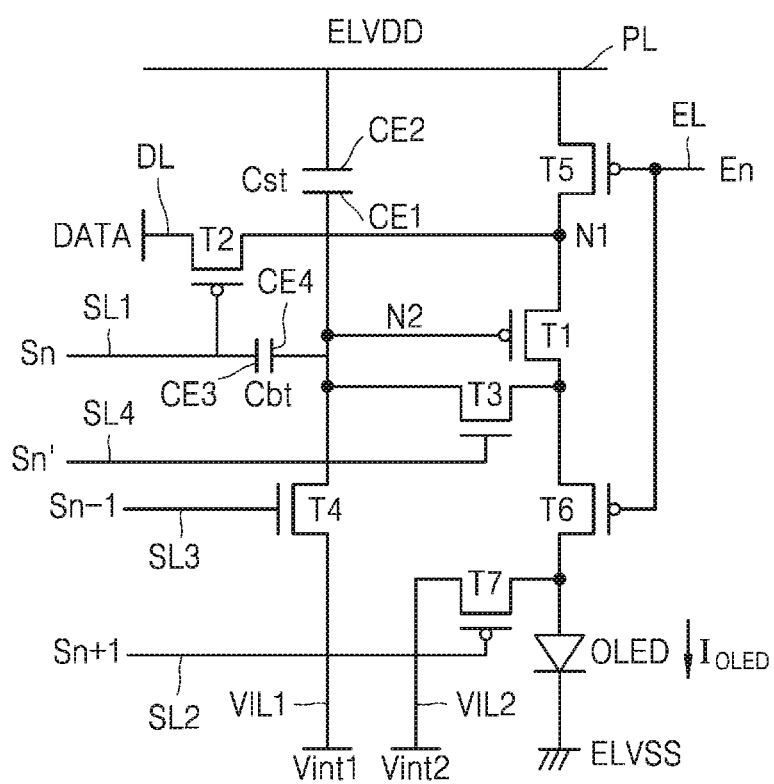
FIG. 2 is an equivalent circuit diagram of a pixel included in a display apparatus according to an embodiment.

FIG. 2 is an equivalent circuit diagram of a pixel included in a display apparatus according to an embodiment.

Referring to FIG. 2, a pixel PX may include a plurality of transistors, for example, first through seventh transistors T1, T2, T3, T4, T5, T6, and T7, a first capacitor Cst, a second capacitor Cbt, an organic light-emitting diode OLED as a display element, and signal lines connected to the above elements, first and second initialization voltage lines VIL1 and VIL2, and a power voltage line PL. The signal lines may include a data line DL, a first scan line SL1, a second scan line SL2, a third scan line SL3, a fourth scan line SL4, and an emission control line EL. According to an embodiment, at least one of the signal lines, the first and second initialization voltage lines VIL1 and VIL2, and/or the power voltage line PL may be shared among neighboring pixels.

The power voltage line PL may be configured to transfer a first power voltage ELVDD to the first transistor T1. The first initialization voltage line VIL1 may be configured to transfer, to the pixel PX, a first initialization voltage Vint1 initializing a voltage of a gate electrode of the first transistor T1. The second initialization voltage line VIL2 may be configured to transfer, to the pixel PX, a second initialization voltage Vint2 initializing an anode (e.g., a pixel electrode) of the organic light-emitting diode OLED.

The first scan line SL1, the second scan line SL2, the third scan line SL3, the fourth scan line SL4, the emission control line EL, and the first and second initialization voltage lines VIL1 and VIL2 may extend in a first direction D1 and be arranged in each row and apart from each other. The data line DL and the power voltage line PL may extend in a second direction D2 and be arranged in each column and apart from each other.

In FIG. 2, the third transistor T3 and the fourth transistor T4 from among the first through seventh transistors T1, T2, T3, T4, T5, T6, and T7 are implemented as an n-channel metal-oxide-semiconductor field-effect transistor (MOSFET) (NMOS), and the other transistors are implemented as a p-channel MOSFET (PMOS).

The first transistor T1 may be connected to the power voltage line PL via the fifth transistor T5 to and electrically connected to the organic light-emitting diode OLED via the sixth transistor T6. The first transistor T1 acts as a driving transistor, and may receive a data signal DATA according to a switching operation of the second transistor T2 to supply a driving current $I_{oled}$ to the organic light-emitting diode OLED.

The second transistor T2 may be connected to the first scan line SL1 and the data line DL and connected to the power voltage line PL via the fifth transistor T5. The second transistor T2 may be turned on according to a first scan signal Sn received via the first scan line SL1 to perform a switching operation of transferring the data signal DATA transferred to the data line DL, to a node N1.

The third transistor T3 may be connected to the fourth scan line SL4 and to the organic light-emitting diode OLED via the sixth transistor T6 to be connected. The third transistor T3 is turned on according to a fourth scan signal Sn' received via the fourth scan line SL4 to diode-connect the first transistor T1.

The fourth transistor T4 is connected to the third scan line SL3, which is a previous scan line, and the first initialization voltage line VIL1, and is turned on according to a third scan signal Sn−1, which is a previous scan signal and received via the third scan line SL3, to transfer the first initialization voltage Vint1 from the first initialization voltage line VIL1 to the gate electrode of the first transistor T1, thereby initializing a voltage of the gate electrode of the first transistor T1.

The fifth transistor T5 and the sixth transistor T6 are connected to the emission control line EL, and are simultaneously turned on according to an emission control signal En received via the emission control line EL to form a current path such that the driving current $I_{OLED}$ may flow in a direction from the power voltage line PL to the organic light-emitting diode OLED.

The seventh transistor T7 is connected to the second scan line SL2, which is a next scan line, and the second initialization voltage line VIL2, and is turned on according to a second scan signal Sn+1, which is a next scan signal and received via the second scan line SL2, to transfer, to the organic light-emitting diode OLED, the second initialization voltage Vint2 from the second initialization voltage line VIL2, thereby initializing the anode (e.g., a pixel electrode) of the organic light-emitting diode OLED. According to an embodiment, the seventh transistor T7 may be omitted.

The first capacitor Cst may include a first lower electrode CE1 and a first upper electrode CE2. The first lower electrode CE1 may be connected to the gate electrode of the first transistor T1, and the first upper electrode CE2 may be connected to the power voltage line PL. The first capacitor Cst may maintain a voltage applied to the gate electrode of the first transistor T1 by storing and maintaining a voltage corresponding to a difference between voltages of two ends of the power voltage line PL and the gate electrode of the first transistor T1.

The second capacitor Cbt may include a second lower electrode CE3 and a second upper electrode CE4. The second lower electrode CE3 may be connected to the first scan line SL1 and a gate electrode of the second transistor T2. The second upper electrode CE4 may be connected to the gate electrode of the first transistor T1 and the first lower electrode CE1 of the first capacitor Cst. The second capacitor Cbt may be a boosting capacitor, and when the first scan signal Sn of the first scan line SL1 is a voltage turning off the second transistor T2, the second capacitor Cbt may increase a voltage of a node N2 to reduce a voltage displaying black (a black voltage).

The organic light-emitting diode OLED may include the pixel electrode (e.g., an anode) and an opposite electrode (e.g., a cathode), and the opposite electrode may receive a second power voltage ELVSS. The organic light-emitting diode OLED may receive the driving current $I_{OLED}$ from the first transistor T1 to emit light, thereby displaying an image.

An operation of each pixel PX according to an embodiment will be described in detail below.

During a first initialization period, when the third scan signal Sn−1 is supplied via the third scan line SL3, the fourth transistor T4 is turned on in accordance with the third scan signal Sn−1, and the gate electrode of the first transistor T1 is initialized by the first initialization voltage Vint1 supplied from the first initialization voltage line VIL1.

During a data programming period, when the first scan signal Sn and the fourth scan signal Sn' are respectively supplied via the first scan line SL1 and the fourth scan line SL4, the second transistor T2 and the third transistor T3 are turned on in accordance with the first scan signal Sn and the fourth scan signal Sn'. Here, the first transistor T1 is diode-connected by the turned-on third transistor T3 and is biased in a forward direction. Then a voltage, for which a threshold voltage Vth of the first transistor T1 is compensated for in the data signal DATA supplied from the data line DL, is applied to the gate electrode of the first transistor T1. The first power voltage ELVDD and a compensated voltage are applied to both ends of the first capacitor Cst, and a charge corresponding to a voltage difference between the both ends of the first capacitor Cst is stored in the first capacitor Cst.

During a light-emission period, the fifth transistor T5 and the sixth transistor T6 are turned on according to the emission control signal En supplied from the emission control line EL. The driving current $I_{OLED}$ according to a voltage difference between a voltage of the gate electrode of the first transistor T1 and the first power voltage ELVDD is generated, and the driving current $I_{OLED}$ is supplied to the organic light-emitting diode OLED via the sixth transistor T6.

During a second initialization period, when the second scan signal Sn+1 is supplied via the second scan line SL2, the seventh transistor T7 is turned on in accordance with the second scan signal Sn+1, and the anode (e.g., the pixel electrode) of the organic light-emitting diode OLED is initialized by the second initialization voltage Vint2 supplied from the second initialization voltage line VIL2.

In an embodiment, at least one of the plurality of transistors T1, T2, T3, T4, T5, T6, and T7 may include a semiconductor layer including an oxide, and the others may include a semiconductor layer including a silicon. In detail, a first transistor that directly affects a brightness of a display apparatus is configured to include a semiconductor layer including polycrystalline silicon having high reliability, and a high-resolution display apparatus may be implemented, accordingly.

Meanwhile, an oxide semiconductor has a high carrier mobility and a low leakage current, and thus a voltage drop thereof is not great despite a long driving time. That is, even at low-frequency driving, changes in colors of an image due to a voltage drop is not great, and thus low-frequency driving may be performed. As the oxide semiconductor has a small leakage current as described above, at least one of the third transistor T3 and the fourth transistor T4, which is connected to the gate electrode of the first transistor T1, may be formed of an oxide semiconductor to prevent a leakage current that may flow to the gate electrode of the first transistor T1 and also reduce power consumption.

Figure 3:
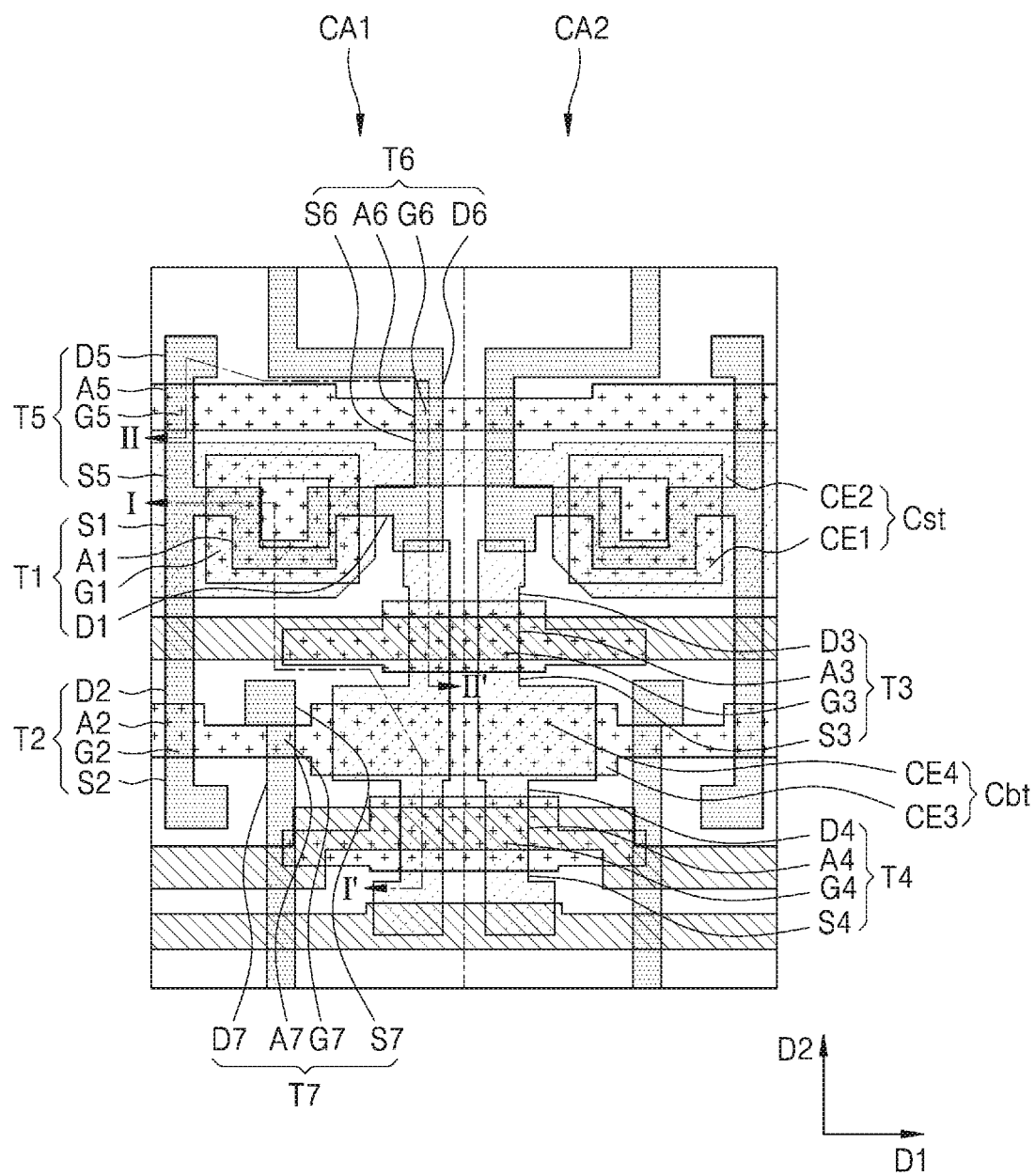
FIG. 3 is a schematic layout diagram showing locations of a plurality or transistors and capacitors arranged in a pair of pixel circuits of a display apparatus according to an embodiment.
Figure 4:
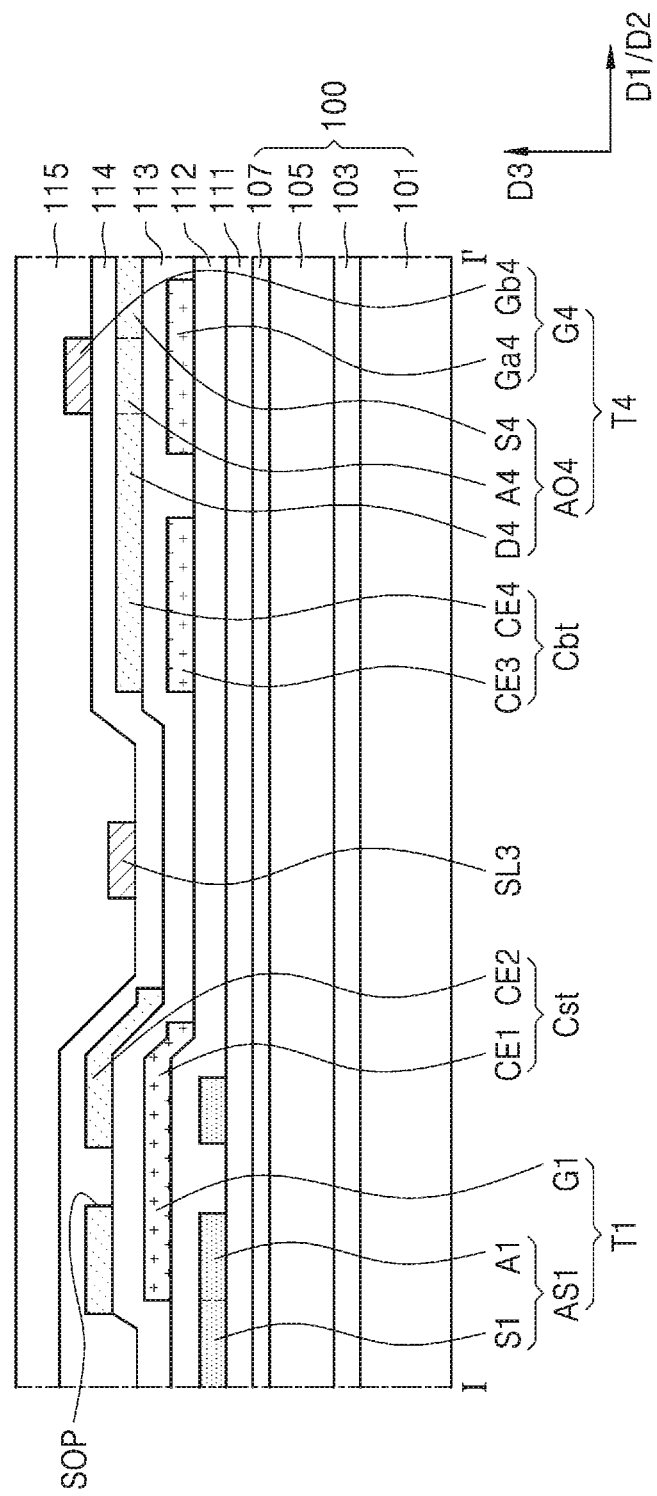
FIG. 4 is a cross-sectional view schematically illustrating a display apparatus according to an embodiment.
Figure 5:
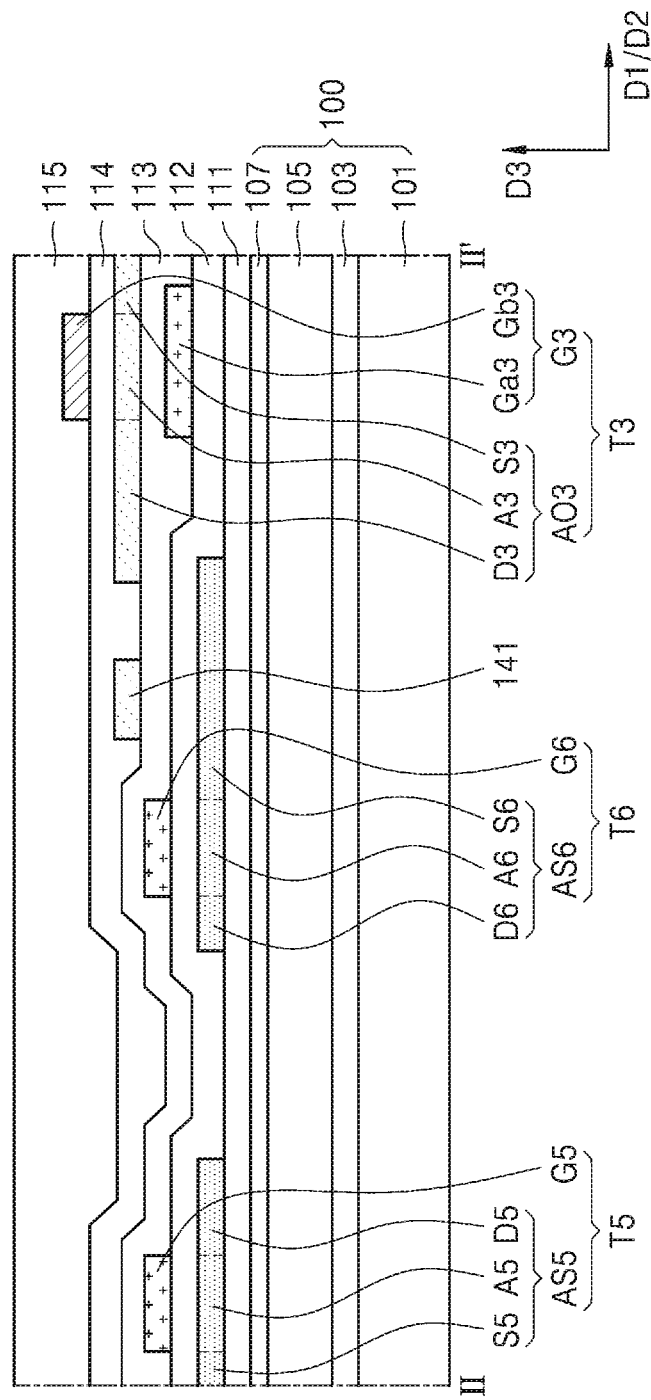
FIG. 5 is a cross-sectional view schematically illustrating a display apparatus according to an embodiment.

FIG. 3 is a schematic layout diagram showing locations of a plurality or transistors and capacitors arranged in a pair of pixel circuits of a display apparatus according to an embodiment. FIG. 4 is a cross-sectional view schematically illustrating a display apparatus according to an embodiment. FIG. 5 is a cross-sectional view schematically illustrating a display apparatus according to an embodiment. FIGS. 6, 7, 8, and 9 are layout diagrams showing components that form the plurality of transistors and the capacitors of FIG. 3, in each of layers. FIG. 4 corresponds to a cross-sectional view of the components of FIG. 3 taken alone line I-I' of FIG. 3, and FIG. 5 corresponds to a cross-sectional view of the components of FIG. 3 taken along line II-II' of FIG. 3.

In FIG. 3, a pair of pixels PX arranged in adjacent columns and in a same row are illustrated. In FIG. 3, a pixel circuit of a pixel arranged in a left pixel area CA1 and a pixel circuit of a pixel arranged in a right pixel area CA2 are bilaterally symmetrical.

Referring to FIG. 3, the pixel circuit may include the first transistor T1, the second transistor T2, the third transistor T3, the fourth transistor T4, the fifth transistor T5, the sixth transistor T6, the seventh transistor T7, the first capacitor Cst, and the second capacitor Cbt.

In an embodiment, the first transistor T1, the second transistor T2, the fifth transistor T5, the sixth transistor T6, and the seventh transistor T7 may include a thin-film transistor including a silicon semiconductor. The third transistor T3 and the fourth transistor T4 may include a thin-film transistor including an oxide semiconductor.

Semiconductor layers of the first transistor T1, the second transistor T2, the fifth transistor T5, the sixth transistor T6, and the seventh transistor T7 may be arranged on a same layer and include a same material. For example, the semiconductor layer may include a polycrystalline silicon. The semiconductor layers of the first transistor T1, the second transistor T2, the fifth transistor T5, the sixth transistor T6, and the seventh transistor T7 may be connected to each other and curved in various shapes.

Each of the semiconductor layers of the first transistor T1, the second transistor T2, the fifth transistor T5, the sixth transistor T6, and the seventh transistor T7 may include a channel area and a source area and a drain area on two sides of the channel area. In an embodiment, the source area and the drain area may be doped with an impurity, and the impurity may include an N-type impurity or a P-type impurity. The source area and the drain area may respectively correspond to a source electrode and a drain electrode. The source area and the drain area may be exchanged according to properties of a transistor. Hereinafter, the terms, the 'source area' and the 'drain area,' will be used instead of the source electrode or the drain electrode.

The first transistor T1 may include a first semiconductor layer AS1 and a first gate electrode G1. The first semiconductor layer AS1 may include a first channel area A1 and a first source area S1 and a first drain area D1 on two sides of the first channel area A1. The first semiconductor layer has a curved shape such that the first channel area A1 is longer than the other channel areas A2, A3, A4, A5, A6, and A7. For example, as the first semiconductor layer has a shape with multiple bends, such as 'S,' 'M,' 'W,' a relatively long channel length may be formed in a relatively small space. As the first channel area A1 is relatively long, a driving range of a gate voltage applied to the first gate electrode G1 is extended, thereby finely controlling gradation of light emitted from the organic light-emitting diode OLED and improving display quality. In an embodiment, the first semiconductor layer may have a linear shape instead of a bent shape. The first gate electrode G1 is an island type and may overlap the first channel area A1 with respect to a first gate insulating layer 112 (see FIG. 4) disposed therebetween.

The first capacitor Cst may be arranged to overlap the first transistor T1. The first capacitor Cst may include the first lower electrode CE1 and the first upper electrode CE2. The first gate electrode G1 may have a function not only as a control electrode with respect to the first transistor T1 but also as the first lower electrode CE1 of the first capacitor Cst. That is, the first gate electrode G1 and the first lower electrode CE1 may be formed integrally. In an embodiment, the first gate electrode G1 and the first lower electrode CE1 may be included as separate components and arranged apart from each other. The first upper electrode CE2 of the first capacitor Cst may be included to overlap the first lower electrode CE1 with a first interlayer insulating layer 113 (FIG. 4) therebetween. The first interlayer insulating layer 113 may act as a dielectric layer of the first capacitor Cst.

The second transistor T2 may include a second semiconductor layer and a second gate electrode G2. The second semiconductor layer may include a second channel area A2 and a second source area S2 and a second drain area D2 on two sides of the second channel area A2. The second source area S2 may be electrically connected to the data line DL (FIG. 2) or the power voltage line PL (FIG. 2), and the second drain area D2 may be connected to the first source area S1. The second gate electrode G2 may be included as a portion of the first scan line SL1 (FIG. 2).

The fifth transistor T5 may include a fifth semiconductor layer and a fifth gate electrode G5. The fifth semiconductor layer may include a fifth channel area A5 and a fifth source area S5 and a fifth drain area D5 on two sides of the fifth channel area A5. The fifth source area S5 may be electrically connected to the data line DL (FIG. 2) or the power voltage line PL (FIG. 2), and the fifth drain area D5 may be connected to the first source area S1. The fifth gate electrode G5 may be included as a portion of the emission control line EL (FIG. 2).

Figure 7:
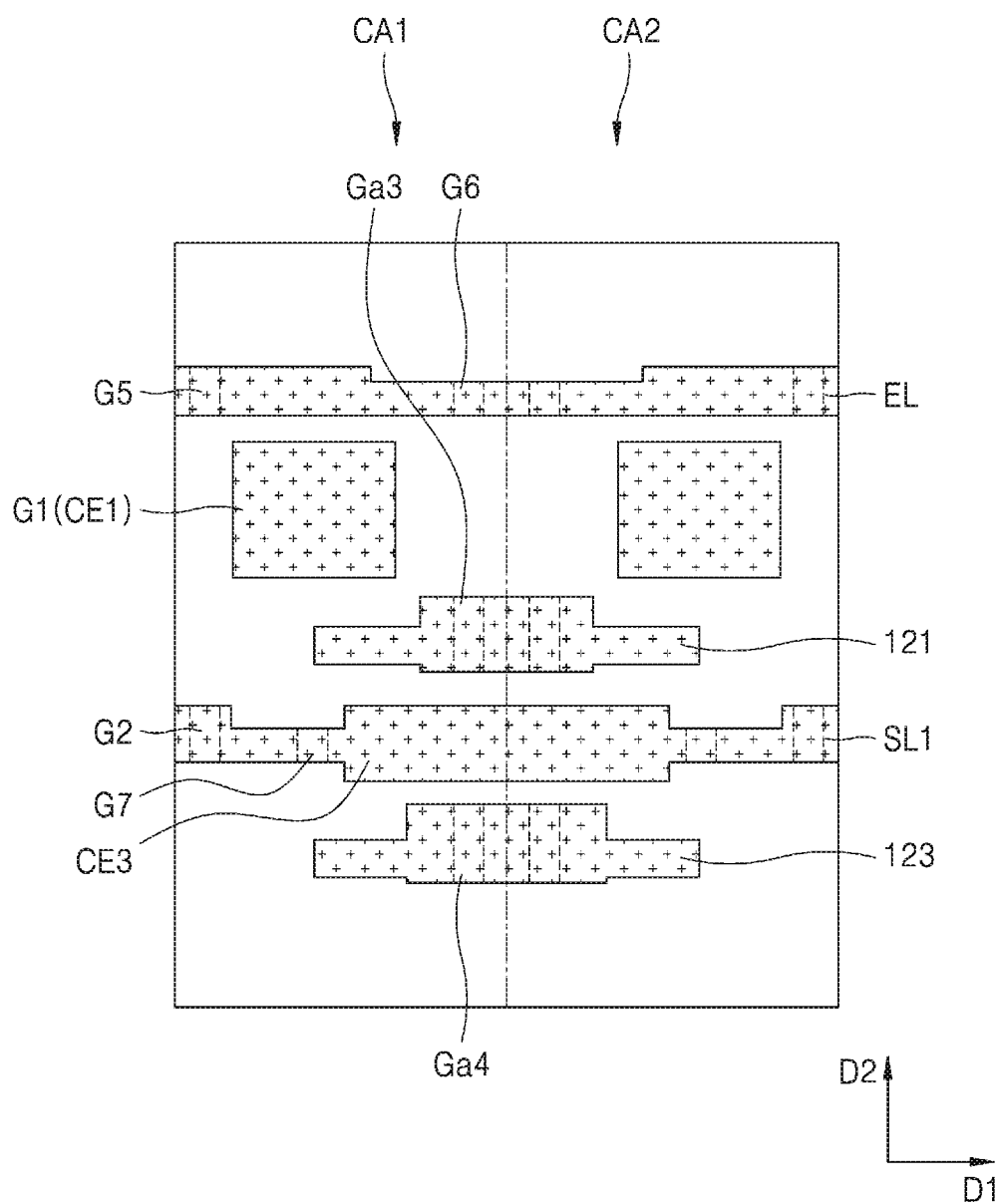

The sixth transistor T6 may include a sixth semiconductor layer and a sixth gate electrode G6. The sixth semiconductor layer may include a sixth channel area A6 and a sixth source area S6 and a sixth drain area D6 on two sides of the sixth channel area A6. The sixth source area S6 may be connected to the first drain area D1, and the sixth drain area D6 may be electrically connected to a pixel electrode 310 (FIG. 12) of the organic light-emitting diode OLED. The sixth gate electrode G6 may be included as a portion of the emission control line EL (FIG. 7).

The seventh transistor T7 may include a seventh semiconductor layer and a seventh gate electrode G7. The seventh semiconductor layer may include a seventh channel area A7 and a seventh source area S7 and a seventh drain area D7 on two sides of the seventh channel area A7. The seventh source area S7 may be electrically connected to the second initialization voltage line VIL2 (FIG. 2), and the seventh drain area D7 may be connected to the sixth drain area D6. The seventh gate electrode G7 may be included as a portion of the first scan line SL1 (FIG. 7).

The second gate insulating layer 114 (FIG. 4) may be arranged on the first, second, and fifth through seventh transistors T1, T2, T5, T6, and T7 including a silicon semiconductor. The third and fourth transistors T3 and T4 including an oxide semiconductor may be arranged on the first interlayer insulating layer 113 (FIG. 4).

The semiconductor layers of the third transistor T3 and the fourth transistor T4 may be arranged on a same layer and may include a same material. For example, the semiconductor layers may be formed of an oxide semiconductor.

The semiconductor layers may include a channel area and a source area and a drain area on two sides of the channel area. In an embodiment, the source area and the drain area may be areas having a carrier density increased by plasma processing. The source area and the drain area may respectively correspond to a source electrode and a drain electrode. Hereinafter, the terms the 'source area' and the 'drain area' will be used instead of the source electrode or the drain electrode.

Figure 9:
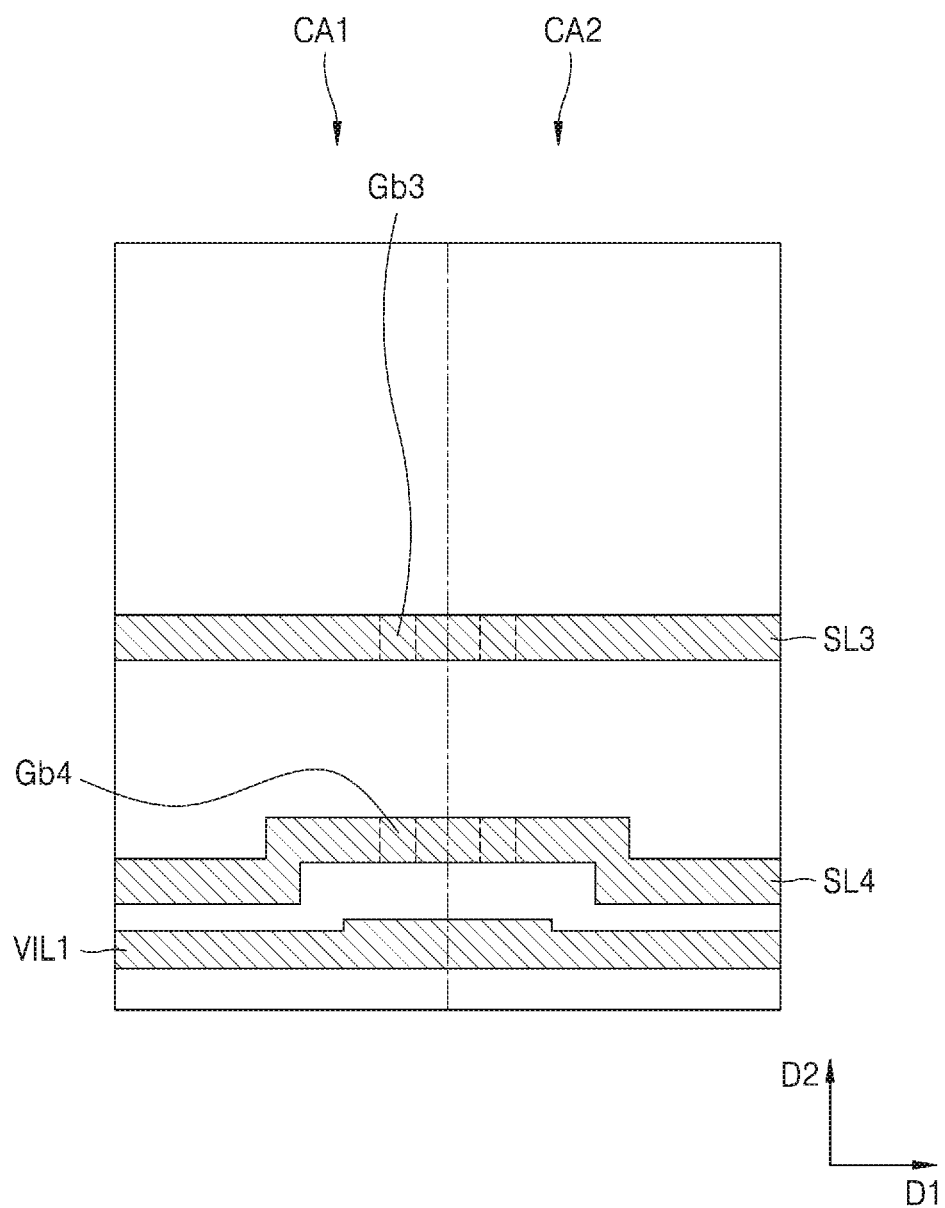

The third transistor T3 may include a third semiconductor layer including an oxide semiconductor and a third gate electrode G3. The third semiconductor layer may include a third channel area A3 and a third source area S3 and a third drain area D3 on two sides of the third channel area A3. The third source area S3 may be electrically connected to the first gate electrode G1. Also, the third source area S3 may be connected to a fourth drain area D4 arranged on a same layer as the source area D3. The third drain area D3 may be electrically connected to the first semiconductor layer AS1 of the first transistor T1 and the sixth semiconductor layer of the sixth transistor T6. The third gate electrode G3 may be included as a portion of the fourth scan line SL4 (FIG. 9).

The fourth transistor T4 may include a fourth semiconductor layer including an oxide semiconductor and a fourth gate electrode G4. The fourth semiconductor layer may include a fourth channel area A4 and a fourth source area S4 and the fourth drain area D4 on two sides of the fourth channel area A4. The fourth source area S4 may be electrically connected to the first initialization voltage line VIL1, and the fourth drain area D4 may be electrically connected to the first gate electrode G1. The fourth gate electrode G4 may be included as a portion of the third scan line SL3 (FIG. 9).

The second gate insulating layer 114 (FIGS. 4 and 5) may be arranged between the third semiconductor layer and the third gate electrode G3 and arranged between the fourth semiconductor layer and the fourth gate electrode G4 to correspond to each channel area.

The second lower electrode CE3 of the second capacitor Cbt may be included as a portion of the first scan line SL1 (FIG. 7) to be connected to the second gate electrode G2. The second upper electrode CE4 of the second capacitor Cbt may be arranged to overlap the second lower electrode CE3, and may include an oxide semiconductor. The second upper electrode CE4 may be arranged on the same layer as the third semiconductor layer of the third transistor T3 and the fourth semiconductor layer of the fourth transistor T4, and may be an area between the third semiconductor layer and the fourth semiconductor layer. Alternatively, the second upper electrode CE4 may extend from the fourth semiconductor layer. Alternatively, the second upper electrode CE4 may extend from the third semiconductor layer.

A second interlayer insulating layer 115 (FIGS. 4 and 5) may be arranged on either the third transistor T3 or the fourth transistor T4 including an oxide semiconductor.

Hereinafter, a structure of the display apparatus 1 according to an embodiment will be described in detail according to a stacking order by referring to FIGS. 4 and 5.

FIGS. 4 and 5 illustrate cross-sections of the display apparatus 1 corresponding to the first transistor T1, the third transistor T3, the fourth transistor T4, the fifth transistor T5, the sixth transistor T6, the first capacitor Cst, and the second capacitor Cbt illustrated in FIG. 3, and some elements may be omitted therein.

The substrate 100 may include a glass material, a ceramic material, a metal material, or a flexible or bendable material. When the substrate 100 is flexible or bendable, the substrate 100 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The substrate 100 may have a single-layer or multi-layer structure of the material, and when substrate 100 has a multi-layer structure, an inorganic layer may be further included. For example, the substrate 100 may include a first base layer 101, a first barrier layer 103, a second base layer 105, and a second barrier layer 107. The first base layer 101 and the second base layer 105 may each include a polymer resin. The first base layer 101 and the second base layer 105 may include a transparent polymer resin. The first barrier layer 103 and the second barrier layer 107 may be barrier layers preventing penetration of external foreign substances, and may be a single-layer or multi-layer structure including an inorganic material such as silicon nitride ($SiN_x$) or silicon oxide ($SiO_x$).

A buffer layer 111 may be arranged on the substrate 100. The buffer layer 111 may have a function of increasing a level of flatness of an upper surface of the substrate 100, and the buffer layer 111 may include an oxide layer such as silicon oxide ($SiO_x$), and/or a nitride layer such as silicon nitride ($SiN_x$), or a silicon oxynitride (SiON).

Figure 6:
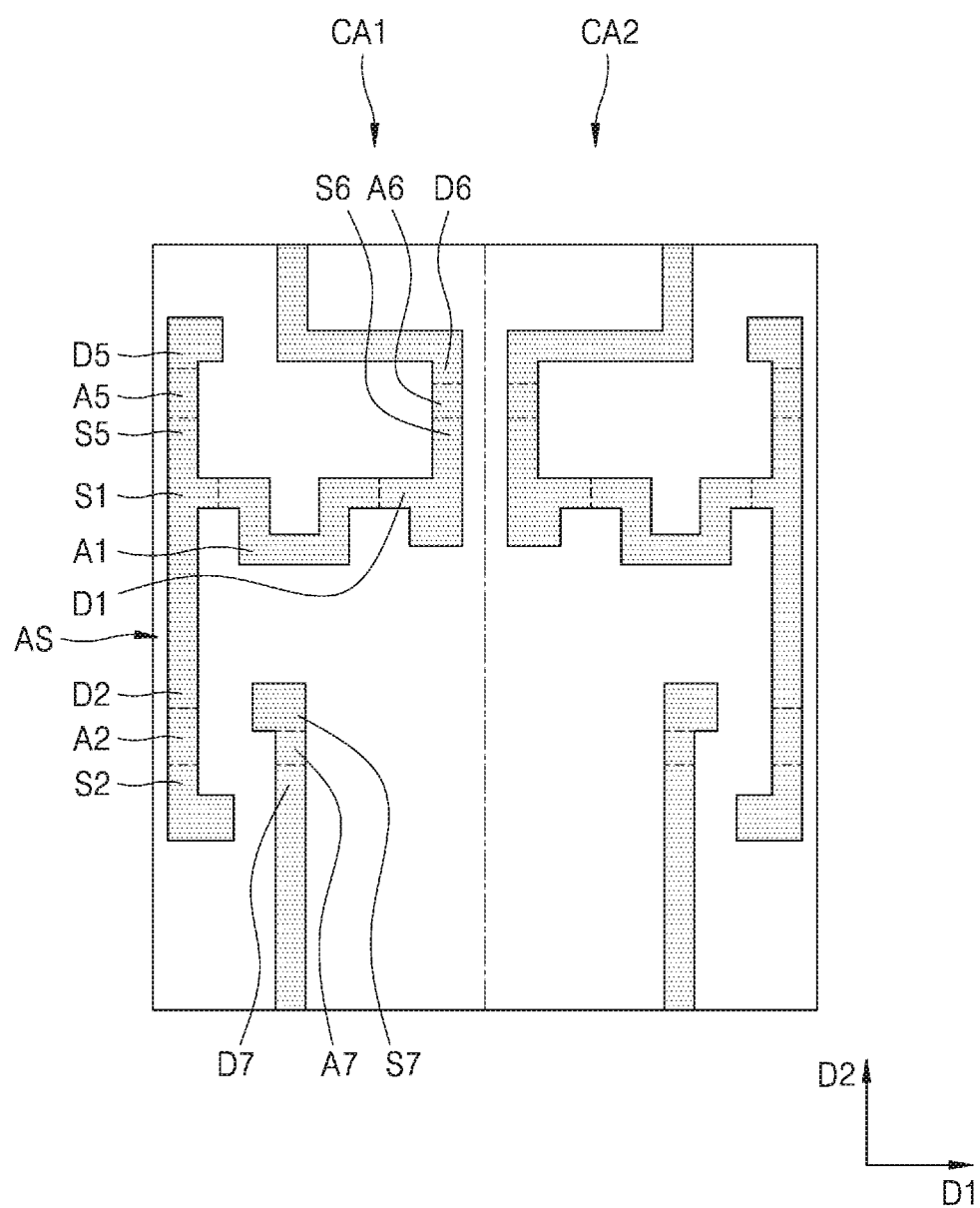
FIGS. 6, 7, 8, and 9 are layout diagrams showing components that form the plurality of transistors and the capacitors of FIG. 3, in each of layers.

As illustrated in FIG. 6, a semiconductor layer AS of the first transistor T1, the second transistor T2, the fifth transistor T5, the sixth transistor T6, and the seventh transistor T7 may be arranged on the buffer layer 111.

The semiconductor layer AS may include the first channel area A1, the first source area S1, and the first drain area D1, which are a first semiconductor layer AS1 of the first transistor T1, the second channel area A2, the second source area S2, and the second drain area D2, which are a second semiconductor layer of the second transistor T2, and the fifth channel area A5, the fifth source area S5, and the fifth drain area D5, which are a fifth semiconductor layer AS5 of the fifth transistor T5, the sixth channel area A6, the sixth source area S6, and the sixth drain area D6, which are a sixth semiconductor layer AS6 of the sixth transistor T6, and the seventh channel area A7, the seventh source area S7, and the seventh drain area D7, which are a seventh semiconductor layer of the seventh transistor T7. That is, each channel area, each source area, and each drain area of the first through seventh transistor T1 through T7 may be portions of the semiconductor layer AS. In FIG. 6, the semiconductor layer of the seventh transistor T7 may be a portion of a semiconductor layer extended from a previous row.

The first gate insulating layer 112 may be disposed on the semiconductor layer AS. The first gate insulating layer 112 may include an inorganic material including an oxide or a nitride. For example, the first gate insulating layer 112 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

As illustrated in FIG. 7, the first gate electrode G1 of the first transistor T1, the second gate electrode G2 of the second transistor T2, the fifth gate electrode G5 of the fifth transistor T5, the sixth gate electrode G6 of the sixth transistor T6, and the seventh gate electrode G7 of the seventh transistor T7 may be arranged on the first gate insulating layer 112. Also, the first scan line SL1 and the emission control line EL may extend and be arranged on the first gate insulating layer 112 in the first direction D1. A portion of the first scan line SL1 may be the second lower electrode CE3 of the second capacitor Cbt. Moreover, a first conductive layer 121 and a second conductive layer 123 that include a same material as that of the first, second, fifth, sixth, and seventh gate electrodes G1, G2, G5, G6, and G7 of the first, second, fifth, sixth, and seventh transistors T1, T2, T5, T6, and T7 may extend and be arranged on the first gate insulating layer 112 in the first direction D1. A portion of the first conductive layer 121 overlapping a third semiconductor layer AO3 of the third transistor T3 may be a lower gate electrode Ga3 of the third transistor T3. A portion of the second conductive layer 123 overlapping a fourth semiconductor layer AO4 of the fourth transistor T4 may be a lower gate electrode Ga4 of the fourth transistor T4.

The lower gate electrode Ga3 of the third transistor T3 may be arranged to overlap the third semiconductor layer AO3 of the third transistor T3 to protect the third semiconductor layer AO3 of the third transistor T3. Also, the lower gate electrode Ga4 of the fourth transistor T4 may be arranged to overlap the fourth semiconductor layer A04 of the fourth transistor T4 to protect the fourth semiconductor layer AO4 of the fourth transistor T4.

The first gate electrode G1 of the first transistor T1 may have an island shape. That is, the first gate electrode G1 of the first transistor T1 is freely floating so that first gate electrode G1 of the first transistor T1 is not connected with fifth gate electrode G5 of the fifth transistor T5 or the first conductive layer 121 etc. The second gate electrode G2 of the second transistor T2 may be a portion of the first scan line SL1 crossing the semiconductor layer AS. The seventh gate electrode G7 of the seventh transistor T7 may be a portion of the first scan line SL1 crossing the semiconductor layer AS or a portion of the second scan line SL2 (FIG. 3) which is a first scan line of a next row. In FIG. 7, an example in which the seventh gate electrode G7 of the seventh transistor T7 of a pixel arranged in a previous row is a portion of the first scan line SL1 crossing the semiconductor layer AS is illustrated. The fifth gate electrode G5 of the fifth transistor T5 and the sixth gate electrode G6 of the sixth transistor T6 may be portions of the emission control line EL crossing the semiconductor layer AS.

The first gate electrode G1 of the first transistor T1 may have a function not only as a control electrode with respect to the first transistor T1 but also the first lower electrode CE1 of the first capacitor Cst.

The first, second, fifth, sixth, and seventh gate electrodes G1, G2, G5, G6, and G7 of the first transistor T1, the second transistor T2, the fifth transistor T5, the sixth transistor T6, and the seventh transistor T7 may include aluminum (Al), platinum (Pt), and palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed in a single-layer or multi-layer structure including one or more of the above materials.

According to an embodiment, the first conductive layer 121 and the second conductive layer 123 may include a same material as that of the first, second, fifth, sixth, and seventh gate electrodes G1, G2, G5, G6, and G7 of the first transistor T1, the second transistor T2, the fifth transistor T5, and the sixth transistor T6, and the seventh transistor T7.

The first interlayer insulating layer 113 may be arranged on the first, second, fifth, sixth, and seventh gate electrodes G1, G2, G5, G6, and G7. The first interlayer insulating layer 113 may include an inorganic material including an oxide or a nitride. For example, the first interlayer insulating layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

Figure 8:
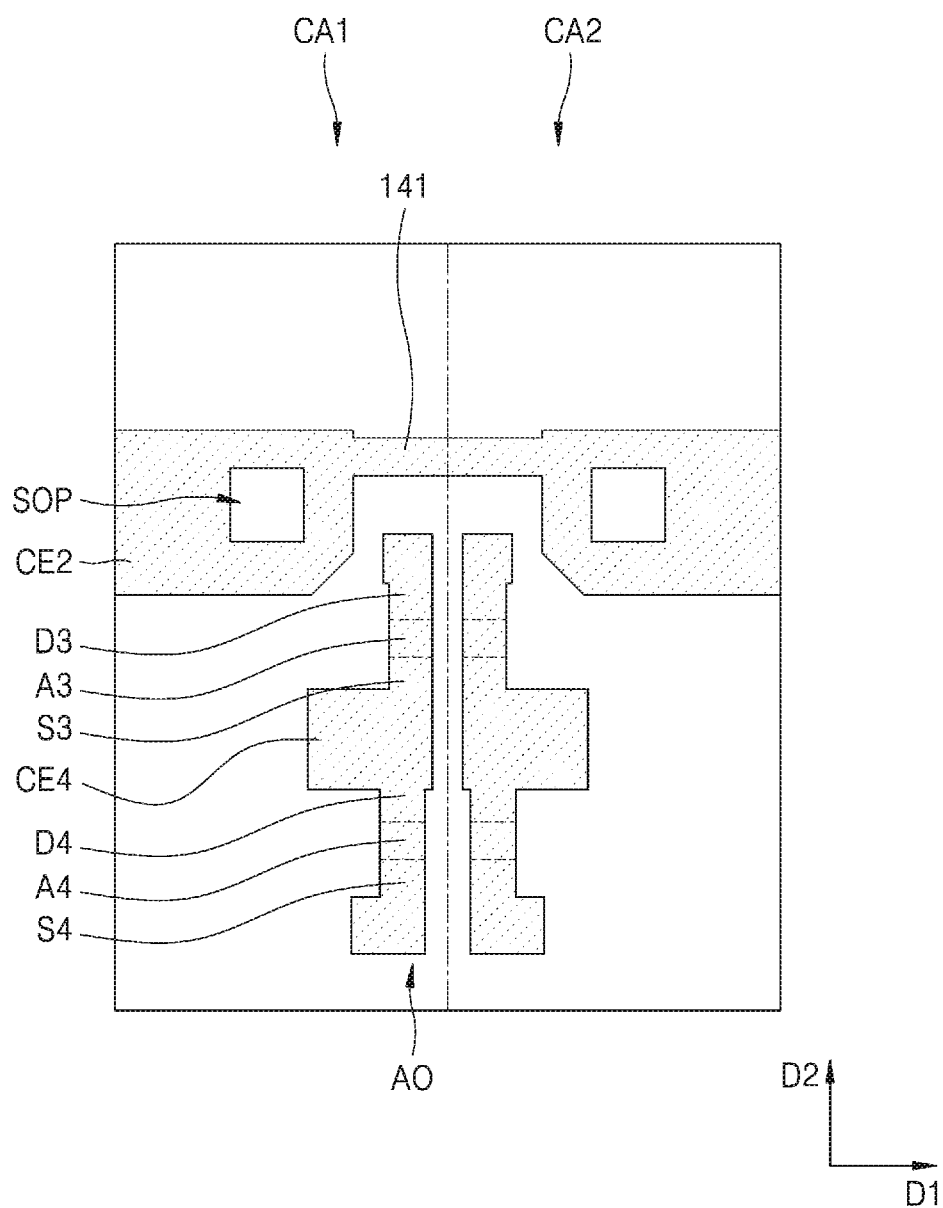

As illustrated in FIG. 8, a semiconductor layer AO including an oxide semiconductor may be arranged on the first interlayer insulating layer 113. The semiconductor layer AO may include a Zn oxide-based material, and may include Zn oxide, In—Zn oxide, Ga—In—Zn oxide, or the like. According to an embodiment, the semiconductor layer AO may include an In—Ga—Zn—O (IGZO), In—Sn—Zn—O (ITZO) or In—Ga—Sn—Zn—O (IGTZO) semiconductor including a metal such as indium (In), gallium (Ga), and tin (Sn) in ZnO.

Each of the third semiconductor layer AO3 of the third transistor T3 and the fourth semiconductor layer AO4 of the fourth transistor T4 may include a channel area and a source area and a drain area which are disposed on both ends of the channel area. The source area and the drain area of the third transistor T3 and the fourth transistor T4 may be formed by imparting conductivity to an oxide semiconductor by adjusting a carrier concentration of the oxide semiconductor. For example, the source area and drain area of each of the third transistor T3 and the fourth transistor T4 may be formed by increasing a carrier concentration of an oxide by performing plasma treatment on the oxide semiconductor by using a hydrogen (H)-based gas, a fluorine (F)-based gas, or a combination thereof.

The semiconductor layer AO may include the third channel area A3, the third source area S3, and the third drain area D3, which are the third semiconductor layer AO3 of the third transistor T3, and the fourth channel area A4, the fourth source area S4, and the fourth drain area D4, which are the fourth semiconductor layer AO4 of the fourth transistor T4. That is, each channel area, each source area, and each drain area of the third transistor T3 and the fourth transistor T4 may be portions of the semiconductor layer AO.

The semiconductor layer AO may include the second upper electrode CE4 of the second capacitor Cbt. The second upper electrode CE4 of the second capacitor Cbt may be located between the third semiconductor layer AO3 of the third transistor T3 and the fourth semiconductor layer AO4 of the fourth transistor T4 on a plan view. The second upper electrode CE4 may extend from the third semiconductor layer AO3 of the third transistor T3 or the fourth semiconductor layer AO4 of the fourth transistor T4. That is, the second upper electrode CE4 may include an oxide semiconductor and may be arranged on the first interlayer insulating layer 113. The first interlayer insulating layer 113 may be arranged between the second lower electrode CE3 and the second upper electrode CE4 of the second capacitor Cbt, and the first interlayer insulating layer 113 may act as a dielectric layer of the second capacitor Cbt.

Further, the first upper electrode CE2 may be arranged on the first interlayer insulating layer 113 to overlap the first lower electrode CE1. A plurality of openings SOP is defined in the first upper electrode CE2. The opening SOP may be formed by removing a portion of the first upper electrode CE2 and may have a closed shape. In an example, the opening SOP may have a square shape. However, in other examples, the opening SOP may have different shapes such as s circle or triangle.

The first interlayer insulating layer 113 may act as a dielectric layer of the first capacitor Cst. The first upper electrodes CE2 of adjacent pixels may be connected to each other by a bridge 141. The bridge 141 may be a portion protruding from the first upper electrode CE2 in the first direction D1 and may be integrally formed with the first upper electrode CE2. That is, the bridge 141 is connectedly disposed between two first upper electrodes CE2.

According to an embodiment, the first upper electrode CE2 may include a same material as the semiconductor layer AO. According to an embodiment, the first upper electrode CE2 may be provided where a conductivity is imparted thereto by adjusting a carrier concentration of an oxide semiconductor. For example, the first upper electrode CE2 may be formed by increasing a carrier concentration of an oxide semiconductor through plasma treatment using a hydrogen (H)-based gas, a fluorine (F)-based gas, or a combination thereof on the oxide semiconductor.

The second gate insulating layer 114 may be arranged above the semiconductor layer AO and the first upper electrode CE2. The second gate insulating layer 114 may include an inorganic material including an oxide or a nitride. For example, the second gate insulating layer 114 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

As illustrated in FIG. 9, the first initialization voltage line VIL1, the third scan line SL3, and the fourth scan line SL4 may be arranged on the second gate insulating layer 114. A portion of the third scan line SL3 overlapping the semiconductor layer AO may be an upper gate electrode Gb3 of the third transistor T3. A portion of the fourth scan line SL4 overlapping the semiconductor layer AO may be an upper gate electrode Gb4 of the fourth transistor T4. That is, the third transistor T3 and the fourth transistor T4 may have a double gate structure including control electrodes on and below the semiconductor layer, respectively.

The upper gate electrode Gb3 of the third transistor T3 and the upper gate electrode Gb4 of the fourth transistor T4 may be arranged on the second gate insulating layer 114, and may have a single-layer or multi-layer structure including at least one of molybdenum (Mo), copper (Cu), titanium (Ti), and the like.

The second interlayer insulating layer 115 may be arranged to cover the third transistor T3 and the fourth transistor T4. The second interlayer insulating layer 115 may be arranged on the upper gate electrode Gb3 of the third transistor T3 and the upper gate electrode Gb4 of the fourth transistor T4.

The second interlayer insulating layer 115 may include an inorganic material including an oxide or a nitride. For example, the second interlayer insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

Figure 10:
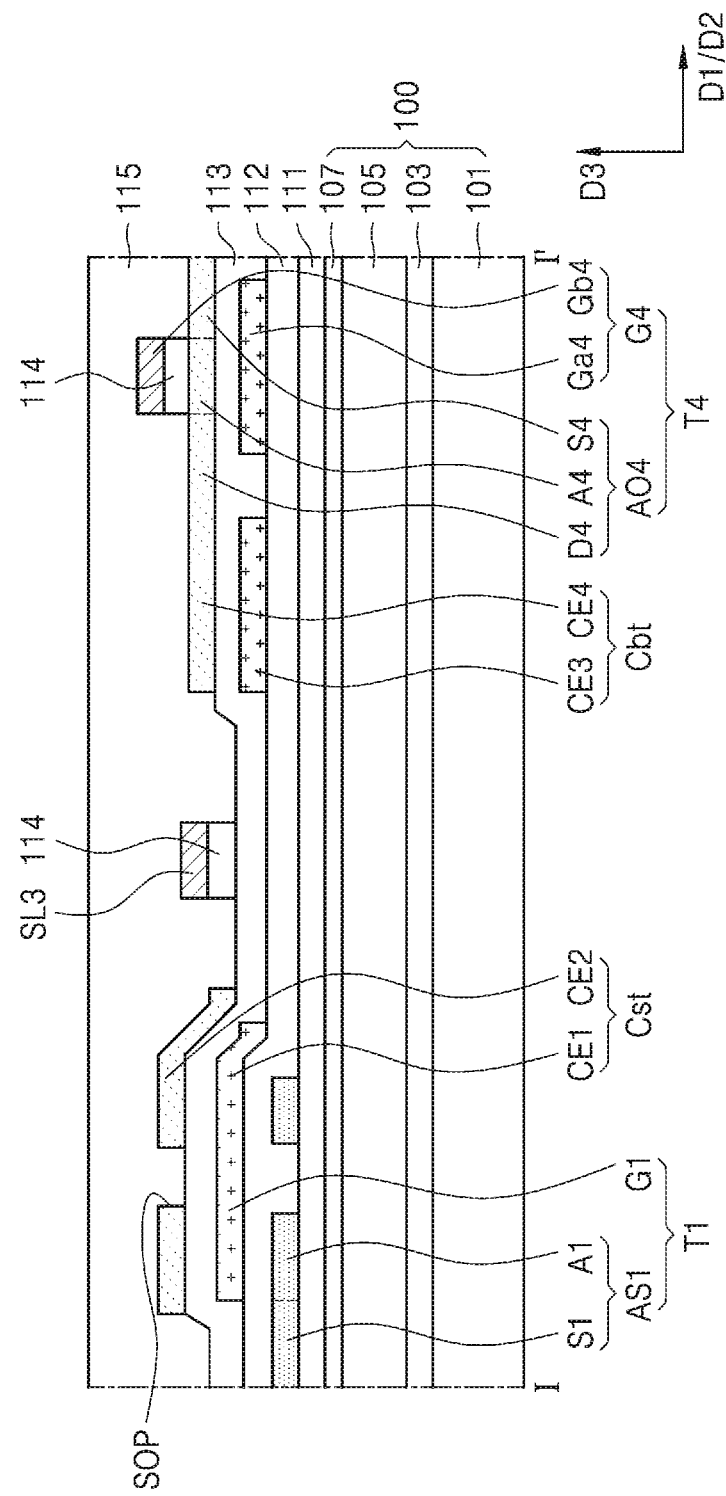
FIG. 10 is a cross-sectional view schematically illustrating a display apparatus according to an embodiment.

FIG. 10 is a cross-sectional view schematically illustrating a display apparatus according to an embodiment. FIG. 10 is a schematic cross-sectional view of the display apparatus taken along line II' of FIG. 3. The embodiment of FIG. 10 is different from the embodiment of FIG. 4 in that the second gate insulating layer 114 is patterned in a form corresponding to electrodes arranged thereon. In FIG. 10, like reference numerals as those of FIG. 4 denote like components, and thus, repeated description thereof will be omitted.

Referring to FIGS. 8, 9, and 10, in an embodiment, the third scan line SL3 and the fourth scan line SL4 may be arranged to at least partially overlap the semiconductor layer AO.

The second gate insulating layer 114 may be arranged between the third scan line SL3 and the fourth scan line SL4 and the semiconductor layer AO. The second gate insulating layer 114 may be patterned in a shape corresponding to the third scan line SL3 and the fourth scan line SL4 arranged thereon.

According to an embodiment, the second gate insulating layer 114 may be patterned in a shape corresponding to the upper gate electrode Gb3 of the third transistor T3. In addition, the second gate insulating layer 114 may be patterned in a shape corresponding to the upper gate electrode Gb4 of the fourth transistor T4.

Figure 11:
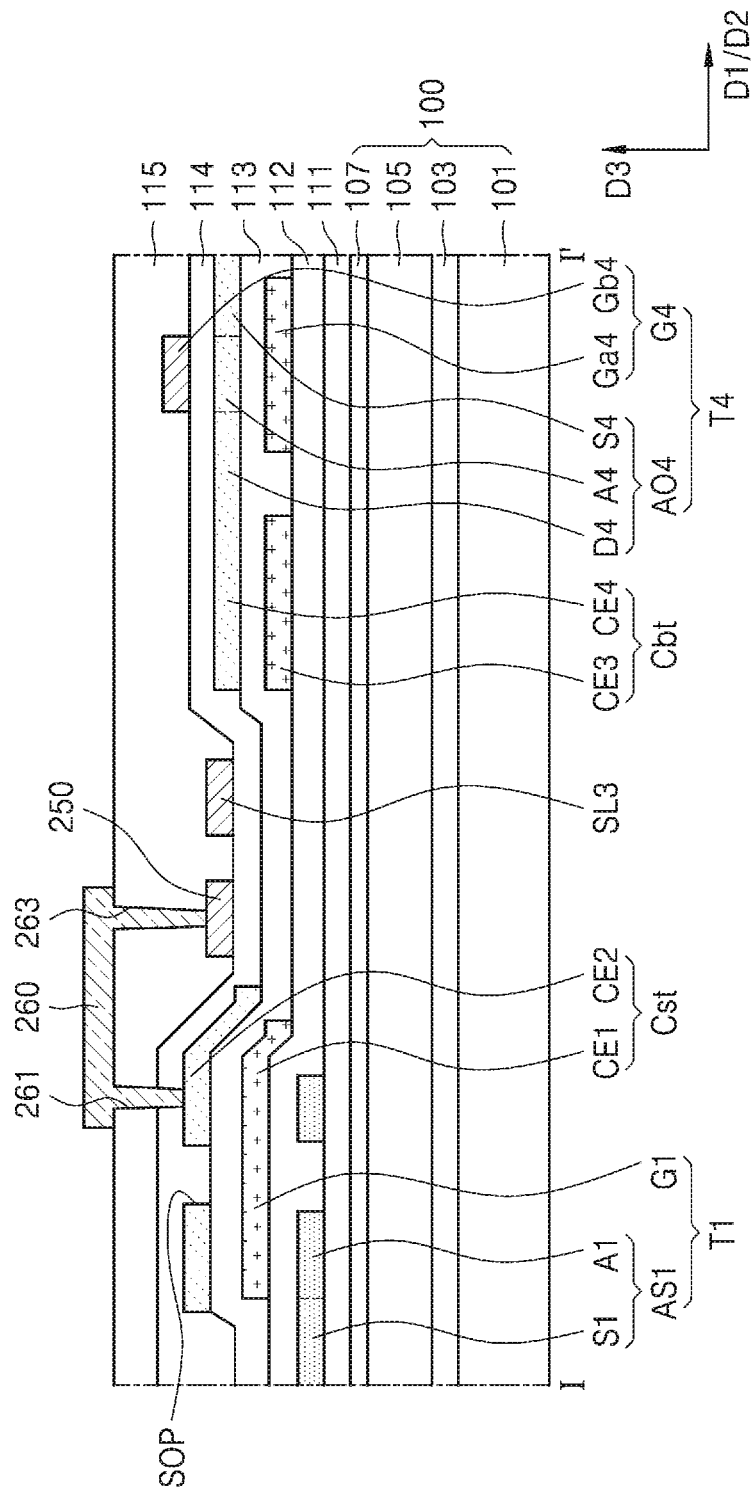
FIG. 11 is a cross-sectional view schematically illustrating a display apparatus according to an embodiment.

FIG. 11 is a cross-sectional view schematically illustrating a display apparatus according to an embodiment. FIG. 11 is a schematic cross-sectional view of the display apparatus taken along line I-I' of FIG. 3. The embodiment of FIG. 11 is different from the embodiment of FIG. 4 in that a first electrode 250 is further arranged on the second gate insulating layer 114, and the first upper electrode CE2 and the first electrode 250 are electrically connected to each other via a second electrode 260 arranged on the second interlayer insulating layer 115. In FIG. 11, like reference numerals as those of FIG. 4 denote like components, and thus, repeated description thereof will be omitted.

Referring to FIGS. 8, 9, and 11, the first initialization voltage line VIL1, the third scan line SL3, and the fourth scan line SL4 may be arranged on the second gate insulating layer 114.

A portion of the third scan line SL3 overlapping the semiconductor layer AO may be the upper gate electrode Gb3 of the third transistor T3. A portion of the fourth scan line SL4 overlapping the semiconductor layer AO may be the upper gate electrode Gb4 of the fourth transistor T4. That is, the third transistor T3 and the fourth transistor T4 may have a double gate structure including control electrodes on and below the semiconductor layer, respectively.

The upper gate electrode Gb3 of the third transistor T3 and the upper gate electrode Gb4 of the fourth transistor T4 may be arranged on the second gate insulating layer 114, and may have a single-layer or multi-layer structure including at least one of molybdenum (Mo), copper (Cu), titanium (Ti), and the like.

In addition, the first electrode 250 may be arranged on the second gate insulating layer 114. The first electrode 250 may include the same material as those of the upper gate electrode Gb3 of the third transistor T3 and the upper gate electrode Gb4 of the fourth transistor T4.

The second interlayer insulating layer 115 may be arranged on the upper gate electrode Gb3 of the third transistor T3, the upper gate electrode Gb4 of the fourth transistor T4, and the first electrode 250. The second electrode 260 may be arranged on the second interlayer insulating layer 115.

The second electrode 260 may have a single-layer or multi-layer structure including at least one of aluminum (Al), copper (Cu), and titanium (Ti), or the like. According to an embodiment, the second electrode 260 may be provided as a triple layer of titanium, aluminum, and titanium (Ti/Al/Ti) that are sequentially arranged.

An end of the second electrode 260 may be electrically connected to the first upper electrode CE2 of the first capacitor Cst through a contact hole 261 formed in the second gate insulating layer 114 and the second interlayer insulating layer 115. In addition, the other end of the second electrode 260 may be electrically connected to the first electrode 250 through a contact hole 263 formed in the second interlayer insulating layer 115.

When a length of the first upper electrode CE2 used as the first upper electrode CE2 of the first capacitor Cst increases, a resistance of the first upper electrode CE2 may increase. In addition, when the first upper electrode CE2 includes an oxide semiconductor, to which conductivity is imparted, a resistance of the first upper electrode CE2 may increase compared to when the first upper electrode CE2 includes a metal material such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

According to an embodiment, by connecting the first electrode 250 including a material having high conductivity, to the first upper electrode CE2, the resistance of the first upper electrode CE2 may be reduced.

Figure 12:
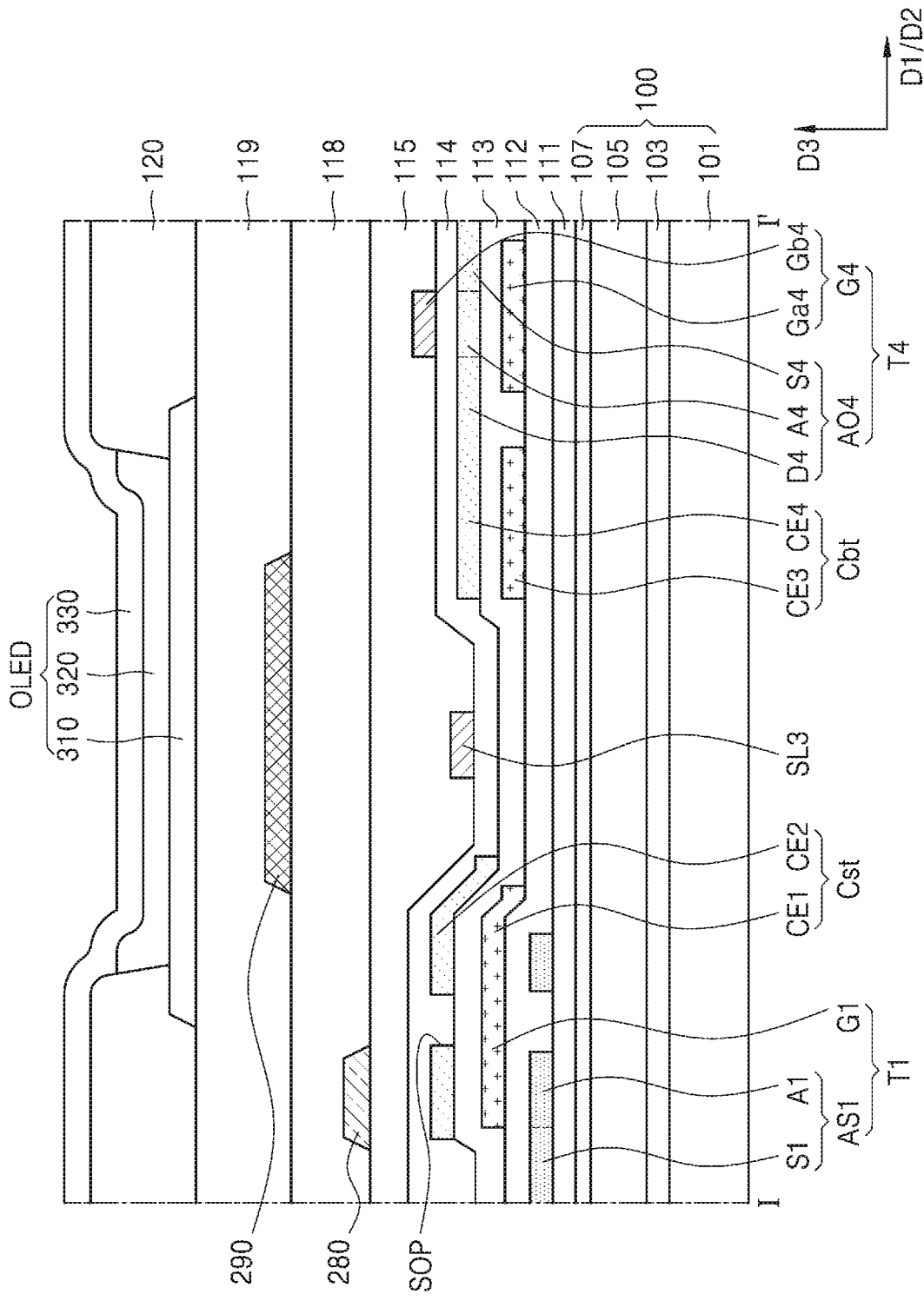
FIG. 12 is a cross-sectional view schematically illustrating a display apparatus according to an embodiment.

FIG. 12 is a cross-sectional view schematically illustrating a display apparatus according to an embodiment. FIG. 12 is a schematic cross-sectional view of the display apparatus taken along line I-I' of FIG. 3. In detail, FIG. 12 is a diagram for describing a stack structure on the second interlayer insulating layer 115. In FIG. 12, like reference numerals as those of FIG. 4 denote like components, and thus, repeated description thereof will be omitted.

Referring to FIG. 12, a third conductive layer 280 may be arranged on the second interlayer insulating layer 115 and may be in direct contact with the second interlayer insulating layer 115. The third conductive layer 280 may be at least one of the power voltage line PL (FIG. 2), the data line DL (FIG. 2), a node connection line, and a connection electrode. The third conductive layer 280 may have a single-layer or multi-layer structure including at least one of aluminum (Al), copper (Cu), and titanium (Ti), or the like. For example, the third conductive layer 280 may include a triple layer of titanium, aluminum, and titanium (Ti/Al/Ti) that are sequentially arranged.

A first planarization layer 118 may be arranged on the third conductive layer 280. A fourth conductive layer 290 may be arranged on the first planarization layer 118 and may be in direct contact with the first planarization layer 118. The fourth conductive layer 290 may be at least one of the power voltage line PL (FIG. 2), the data line DL (FIG. 2), a node connection line, and a connection electrode.

According to an embodiment, the data line DL (FIG. 2) may be arranged on the second interlayer insulating layer 115, and the power voltage line PL (FIG. 2) may be arranged on the first planarization layer 118. According to an embodiment, the power voltage line PL (FIG. 2) may be arranged on the second interlayer insulating layer 115 and the data line DL (FIG. 2) may be arranged on the first planarization layer 118.

A second planarization layer 119 may be arranged on the fourth conductive layer 290. The first planarization layer 118 and the second planarization layer 119 may include an organic material such as acrylic, benzocyclobutene (BCB), polyimide, or hexamethyldisiloxane (HMDSO). Alternatively, the first planarization layer 118 and the second planarization layer 119 may include an inorganic material. The first planarization layer 118 and the second planarization layer 119 may act as a protective layer covering the first through seventh transistors T1, T2, T3, T4, T5, T6, and T7, and upper portions of the first planarization layer 118 and the second planarization layer 119 may be flattened. The first planarization layer 118 and the second planarization layer 119 may be provided as a single layer or multiple layers.

An organic light-emitting diode OLED may be arranged on the second planarization layer 119. The organic light-emitting diode OLED may include the pixel electrode 310, an intermediate layer 320, and an opposite electrode 330.

The pixel electrode 310 may be arranged on the second planarization layer 119 and may be in direct contact with the second planarization layer 119. The pixel electrode 310 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, the pixel electrode 310 may have a structure having layers including ITO, IZO, ZnO, or In₂O₃ above or below the above-described reflective layer. In this case, the pixel electrode 310 may have a structure in which indium tin oxide (ITO)/silver (Ag)/indium tin oxide (ITO) are sequentially stacked.

A pixel defining layer 120 may be arranged on the second planarization layer 119. An opening corresponding to each pixel is defined in the pixel defining layer 120. That is, an opening, through which at least a portion of the pixel electrode 310 is exposed, thereby defining a pixel. In addition, the pixel defining layer 120 may increase a distance between an edge of the pixel electrode 310 and the opposite electrode 330 above the pixel electrode 310 to thereby perform a function of preventing an arc or the like at the edge of the pixel electrode 310. The pixel defining layer 120 may include an organic material such as polyimide or HMDSO.

The intermediate layer 320 of the organic light-emitting diode OLED may include a low molecular weight organic material or a polymer organic material. When the intermediate layer 320 includes a low molecular weight organic material, a hole injection layer (HIL), a hole transport layer (HTL), an emission layer (EML), an electron transport layer (ETL), an electron injection layer (EIL), or the like may be stacked in a single or complex structure, and the intermediate layer 320 may include various organic materials including copper phthalocyanine (CuPc), N,N-di(naphtha-len-1-yl)-N,N'-di Phenyl-benzidine (N,N'-Di(naphthalene-1-yl)-N, N'-diphenyl-benzidine (NPB), tris-8-hydroxyqui-noline aluminum (Alq3), or the like. These layers may be formed using a vacuum evaporation method.

When the intermediate layer 320 includes a polymer organic material, it may have a structure including an HTL and an EML. The HTL may include PEDOT, and the EML may include a polymer material such as poly-phenylvi-nylene (PPV)-based material and polyfluorene-based material. The intermediate layer 320 may be formed by screen printing, inkjet printing, laser induced thermal imaging (LITI), or the like.

The intermediate layer 320, however, is not necessarily limited thereto, and may have other various structures. In addition, the intermediate layer 320 may include a layer that is integrally formed over the plurality of pixel electrodes 310, or may include a layer patterned to correspond to each of the plurality of pixel electrodes 310.

The opposite electrode 330 may be formed integrally with respect to a plurality of organic light-emitting diodes to correspond to the plurality of pixel electrodes 310.

As the organic light-emitting diode OLED is likely damaged by moisture or oxygen from the outside, an encapsulation layer (not shown) or a sealing substrate (not shown) may be arranged on the organic light-emitting diode OLED to protect the organic light-emitting diode OLED. The encapsulation layer (not shown) may cover the display area DA and extend beyond the display area DA. The encapsulation layer may include an inorganic film layer including at least one inorganic material and an organic film layer including at least one organic material. According to an embodiment, a thin-film encapsulation layer may be provided in a structure in which a first inorganic film layer, an organic film layer, and a second inorganic film layer are sequentially stacked. The sealing substrate (not shown) may be arranged to face the substrate 100 and bonded to the substrate 100 by using a sealing member such as a sealant or frit in the peripheral area PA.

In addition, a spacer (not shown) for preventing mask imprinting may be further included on the pixel defining layer 120, and various functional layers such as a polarizing layer, a black matrix, a color filter that are used to reduce external light reflection, and/or a touch screen layer including a touch electrode may be provided on the encapsulation layer.

According to an embodiment, a lower gate electrode of a second thin-film transistor including an oxide semiconductor, is arranged on a same layer as a gate electrode of a first thin-film transistor including a silicon semiconductor, and an upper electrode of a capacitor includes an oxide semiconductor, to which conductivity is imparted. Accordingly, the manufacturing costs of a display apparatus may be reduced as a number of insulating layers and lines and thus a number of masks used in a process are reduced, and also, a number of operations of the manufacturing process of the display apparatus and a process defect ratio may be reduced, accordingly.

According to an embodiment, by electrically connecting a first electrode including a material having a high conductivity, to an upper electrode including an oxide semiconductor, a resistance of the upper electrode may be reduced.

According to the embodiment as described above, as a driving circuit driving a display element is configured to include a first thin-film transistor including a silicon semiconductor and a second thin-film transistor including an oxide semiconductor, a high-resolution display apparatus with low power consumption may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate including a display area in which a display element is arranged;
   a first thin-film transistor arranged in the display area and including a first semiconductor layer and a first gate electrode insulated from the first semiconductor layer, the first semiconductor layer including a silicon semiconductor;
   a first interlayer insulating layer covering the first gate electrode;
   a second thin-film transistor including a second semiconductor layer disposed on the first interlayer insulating layer and including an oxide semiconductor, a second gate electrode insulated from the second semiconductor layer, and a third gate electrode disposed between the substrate and the second semiconductor layer; and
   an upper electrode arranged on the first interlayer insulating layer and including a same material as that of the second semiconductor layer and overlapping at least a portion of the first gate electrode,
   wherein the third gate electrode at least partially overlaps the second semiconductor layer, and
   wherein the third gate electrode is arranged on a same layer as the first gate electrode.

2. The display apparatus of claim 1, further comprising a lower electrode arranged on a same layer as the first gate electrode,
   wherein the lower electrode and the upper electrode constitute a capacitor.

3. The display apparatus of claim 2, wherein the first gate electrode and the lower electrode are integrally formed.

4. The display apparatus of claim 1, wherein at least a portion of the upper electrode is imparted with conductivity.

5. The display apparatus of claim 1, wherein an opening having a closed shape is formed in the upper electrode.

6. The display apparatus of claim 1, further comprising a first gate insulating layer covering the first semiconductor layer.

7. The display apparatus of claim 6, wherein the third gate electrode is disposed on the first gate insulating layer.

8. The display apparatus of claim 1, further comprising a second gate insulating layer disposed between the second semiconductor layer and the second gate electrode.

9. The display apparatus of claim 8, further comprising a second interlayer insulating layer disposed on the second gate electrode.

10. The display apparatus of claim 9, further comprising a first electrode arranged on the second gate insulating layer.

11. The display apparatus of claim 10, further comprising a second electrode disposed on the second interlayer insulating layer and including one end electrically connected to the upper electrode and another end electrically connected to the first electrode.

12. The display apparatus of claim 11, further comprising a planarization layer covering the second electrode,
wherein the display element includes an organic light-emitting diode arranged on the planarization layer.

13. A display apparatus comprising:
a substrate including a display area in which a display element is arranged;
a first thin-film transistor arranged in the display area and including a first semiconductor layer and a first gate electrode insulated from the first semiconductor layer, the first semiconductor layer including a silicon semiconductor;
a first interlayer insulating layer covering the first gate electrode;
a second thin-film transistor including a second semiconductor layer disposed on the first interlayer insulating layer and including an oxide semiconductor, a second gate electrode insulated from the second semiconductor layer, and a third gate electrode disposed between the substrate and the second semiconductor layer; and
a capacitor including a lower electrode on a same layer as the first gate electrode and an upper electrode that is arranged on the first interlayer insulating layer, at least partially overlaps the lower electrode, and includes an oxide semiconductor,
wherein the third gate electrode at least partially overlaps the second semiconductor layer, and
wherein the third gate electrode is arranged on a same layer as the first gate electrode.

14. The display apparatus of claim 13, wherein the first gate electrode and the lower electrode are integrally formed.

15. The display apparatus of claim 13, wherein at least a portion of the upper electrode is imparted with conductivity.

16. The display apparatus of claim 13, further comprising a second interlayer insulating layer disposed on the second gate electrode.

17. The display apparatus of claim 16, further comprising:
a first electrode disposed on a same layer as the second gate electrode; and
a second electrode disposed on the second interlayer insulating layer and having one end electrically connected to the upper electrode and another end electrically connected to the first electrode.

18. The display apparatus of claim 13, wherein the upper electrode and the second semiconductor layer include a same material as each other.

* * * * *